(12) United States Patent
Yun

(10) Patent No.: US 7,977,226 B2
(45) Date of Patent: Jul. 12, 2011

(54) FLASH MEMORY DEVICE AND METHOD OF FABRICATING THE SAME

(75) Inventor: Ki Jun Yun, Suwon-si (KR)

(73) Assignee: Dongbu HiTek Co., Ltd., Seoul (KR)

( * ) Notice: Subject to any disclaimer, the term of this patent is extended or adjusted under 35 U.S.C. 154(b) by 21 days.

(21) Appl. No.: 12/643,655

(22) Filed: Dec. 21, 2009

(65) Prior Publication Data
US 2010/0163967 A1    Jul. 1, 2010

(30) Foreign Application Priority Data

Dec. 30, 2008   (KR) .................. 10-2008-0136287

(51) Int. Cl.
*H01L 21/3205*   (2006.01)

(52) U.S. Cl. ........ 438/587; 438/584; 438/585; 438/586; 438/588; 438/760; 438/780; 257/314; 257/315; 257/316; 257/317; 257/318; 257/319; 257/320; 257/321; 257/322; 257/323; 257/324; 257/E27.078; 257/E29.3; 257/E29.309; 257/E21.179; 257/E21.182; 257/E21.209; 257/E21.21; 257/E21.422; 257/E21.423; 257/E21.679; 257/E21.694

(58) Field of Classification Search ........................ None
See application file for complete search history.

(56) References Cited

U.S. PATENT DOCUMENTS

2006/0239083 A1 * 10/2006 Lee .......................... 365/185.28
* cited by examiner

*Primary Examiner* — Charles D Garber
*Assistant Examiner* — Yasser A Abdelaziez
(74) *Attorney, Agent, or Firm* — The Law Offices of Andrew D. Fortney; Andrew D. Fortney; Theresa J. Mahan

(57) ABSTRACT

A flash memory device and a method for fabricating the same are disclosed. The flash memory device includes an ONO layer on a substrate, polysilicon gates on the ONO layer, a gate oxide layer on the substrate, the ONO layer and the polysilicon gates, and a low temperature oxide layer and polysilicon sidewall spacers on outer side surfaces of the polysilicon gates, except in a region between nearest adjacent polysilicon gates.

11 Claims, 4 Drawing Sheets

FLASH MEMORY DEVICE AND METHOD OF FABRICATING THE SAME

CROSS REFERENCE TO RELATED APPLICATION

This application claims the benefit of Korean Patent Application No. 10-2008-0136287, filed on Dec. 30, 2008, which is hereby incorporated by reference as if fully set forth herein.

BACKGROUND OF THE DISCLOSURE

1. Field of the Disclosure

The present invention relates to a semiconductor device, and more particularly, to a flash memory device and a method for fabricating the same.

2. Discussion of the Related Art

Flash memories are nonvolatile memory devices that are becoming more and more versatile as main-memory devices. Also, such flash memories have been embedded in various products.

To embody such an embedded flash memory, formation of a control gate and a floating gate is one of the most important processes. In addition, it can be challenging to form both the control gate and the floating gate.

Generally, a polysilicon layer can be formed between lines somewhat uniformly to form the control gate. The polysilicon layer is removed by dry etching at an etch selectivity ratio of oxide to polysilicon. However, removing the entire polymer from the control gate lines may result in an inadvertently etched floating gate. As a result, characteristics of the flash memory can deteriorate.

SUMMARY OF THE DISCLOSURE

Accordingly, the present invention is directed to a flash memory device and a method for fabricating the same.

An object of the present invention is to provide a flash memory device that is able to prevent inadvertent etching of a floating gate during removal of polysilicon material when forming the polysilicon gates, and a method for fabricating the flash memory device.

Additional advantages, objects, and features of the disclosure will be set forth in part in the description which follows and in part will become apparent to those skilled in the art upon examination of the following or may be learned from practice of the invention. The objectives and other advantages of the invention may be realized and attained by the structure(s) particularly pointed out in the written description and claims hereof as well as the appended drawings.

To achieve these objects and other advantages and in accordance with the purpose(s) of the invention, as embodied and broadly described herein, a flash memory device may include an ONO layer on a substrate; polysilicon gates on the ONO layer; a gate oxide layer on the substrate having the ONO layer and the polysilicon gates thereon; and a low temperature oxide layer and control gates on outer surfaces of the polysilicon gates.

In another aspect of the present invention, a method for fabricating a flash memory device may include forming an ONO layer and a first polysilicon layer on a substrate; forming a plurality of floating gates by patterning and etching the ONO layer and the first polysilicon layer; forming a gate oxide layer on the substrate having the plurality of floating gates thereon; forming a resin on the substrate having the gate oxide layer thereon; removing the resin (e.g., in an asking process) to expose the gate oxide layer on the plurality of floating gates; removing a portion of the resin exposed by a photoresist pattern over resin between the nearest adjacent floating gates; forming a second polysilicon layer between the plurality of floating gates formed on the substrate having the resin remaining between nearest adjacent floating gates; forming sidewall spacers on the plurality of floating gates (or patterned first polysilicon layer) by removing the second polysilicon layer on the resin between the nearest adjacent floating gates in an anisotropic etching process; and removing the remaining resist between the nearest adjacent floating gates.

According to various embodiments of the present invention, a novolak resin is formed between polysilicon gates. As a result, inadvertent etching of the floating gates during a conventional process of removing the polysilicon material when forming the patterned polysilicon gates may be prevented.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the disclosure and are incorporated in and constitute a part of this application, illustrate embodiment(s) of the disclosure and together with the description serve to explain the principle(s) of the disclosure. In the drawings.

DETAILED DESCRIPTION

Reference will now be made in detail to embodiments of the present invention, examples of which are illustrated in the accompanying drawings. Wherever possible, the same reference numbers will be used throughout the drawings to refer to the same or like parts.

Figure 1:
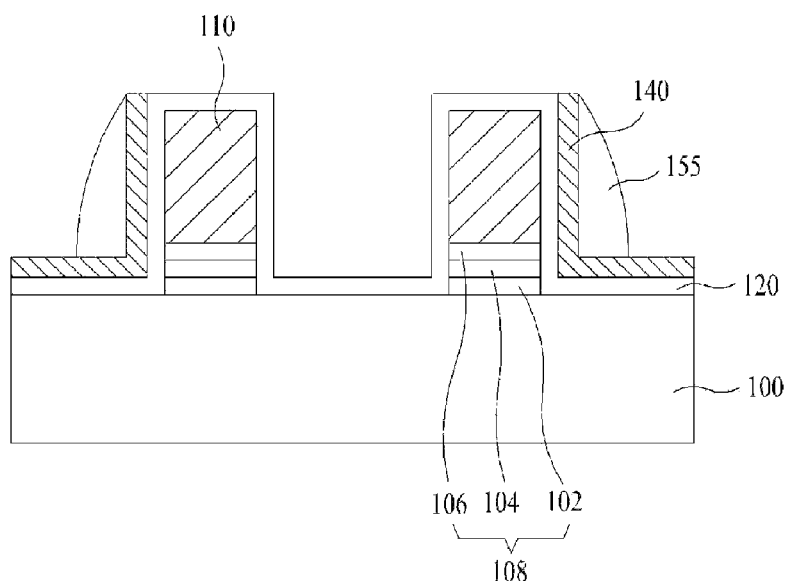
FIG. 1 is a cross-sectional view illustrating a flash memory device according to an exemplary embodiment of the present invention.

FIG. 1 is a cross-sectional view illustrating a flash memory device according to an exemplary embodiment of the present invention.

In reference to FIG. 1, the flash memory device includes an oxide-nitride-oxide (ONO) layer 108 on a substrate, polysilicon gates 110 on the ONO layer 108, a gate oxide layer 120 on the substrate, low temperature oxide layers 140 and control gates 155. The polysilicon gates 110 may serve as floating gates, in one embodiment. The gate oxide layer 120 covers or surrounds the ONO layers 108 and the polysilicon gates 110. The low temperature oxide layer 140 is on a predetermined outer sidewall and/or side surface of each polysilicon gate 110, in which the outer sidewall and/or side surface is furthest from a nearest polysilicon gate 110.

FIGS. 2A to 2G are cross-sectional views illustrating structures formed during an exemplary method for fabricating the flash memory device.

Figure 2A:
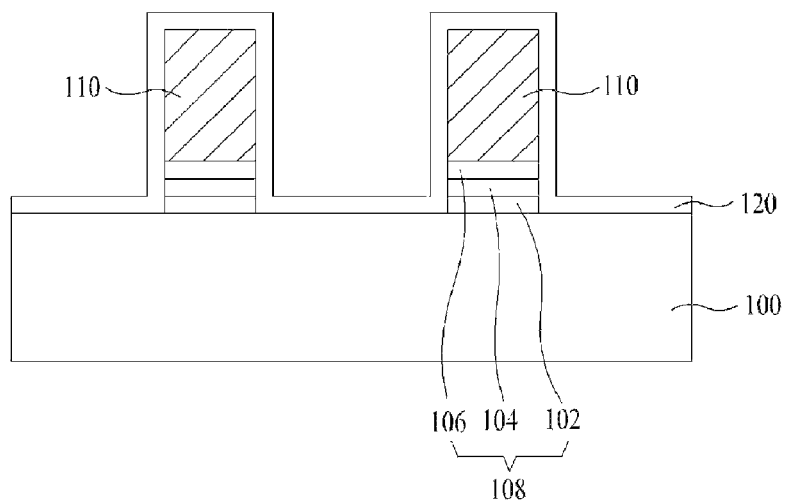
FIGS. 2A to 2G are cross-sectional views illustrating intermediate structures in an exemplary method for fabricating a flash memory according to various embodiments of the present invention.

In reference to FIG. 2A, after the ONO layer 108 and the first polysilicon layer (not shown) are sequentially formed on the substrate 100, a photoresist material (not shown) is coated thereon and patterned (e.g., by photolithography and development) to form a photoresist pattern (not shown).

Thereafter, the ONO layer 108 and the (undoped) first polysilicon layer (not shown) are etched using the photoresist pattern, forming the polysilicon gates 110. The ONO layer 108 comprises a tunnel oxide layer 102 between the substrate 100 and the polysilicon gate 110, a trap nitride layer 104 thereon, and a block oxide layer 106 on or over the nitride layer 104. Thus, the interface between the tunnel oxide layer 102 and the trap nitride layer 104 may also serve as a floating gate.

After the photoresist pattern (not shown) is removed in an asking process, the gate oxide layer 120 is formed on or over the substrate 100, the ONO layer 108, and the polysilicon gates 110. Generally, the gate oxide layer 120 comprises a silicon dioxide layer, which may be deposited by chemical vapor deposition from silane and oxygen (e.g., an undoped silicate glass, or USG) or tetraethyl orthosilicate (TEOS) and oxygen and/or ozone.

Figure 2B:
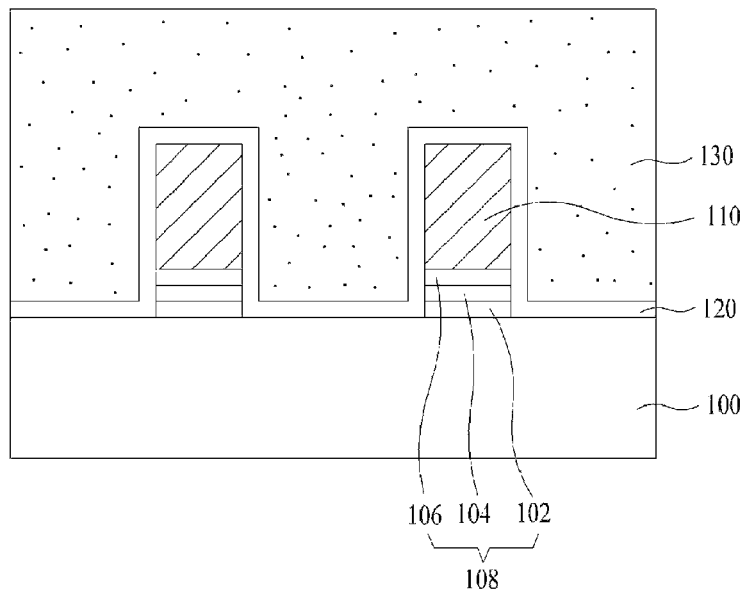

Hence, as shown in FIG. 2B, a novolak resin 130 is formed on or over the gate oxide layer 120, including the region between the nearest adjacent polysilicon gates 110.

Figure 2C:
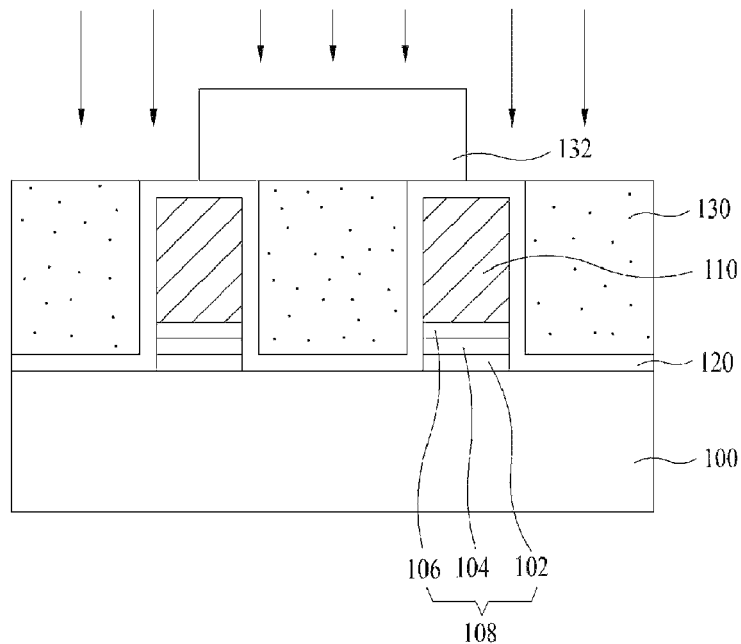

As shown in FIG. 2C, an asking process is performed on the substrate 100 having the novolak resin 130 formed thereon. An upper portion of the novolak resin 130 is removed to expose the gate oxide layer 120 on the polysilicon gate 110.

Thereafter, a photoresist material (not shown) is coated on the substrate 100 having the exposed gate oxide 120 over the polysilicon gates 110. Then, the photoresist material (not shown) is photolithographically patterned and developed, and the photoresist pattern 132 formed thereby covers the entire portion of the novolak resin 130 between the nearest adjacent polysilicon gates 110.

Figure 2D:
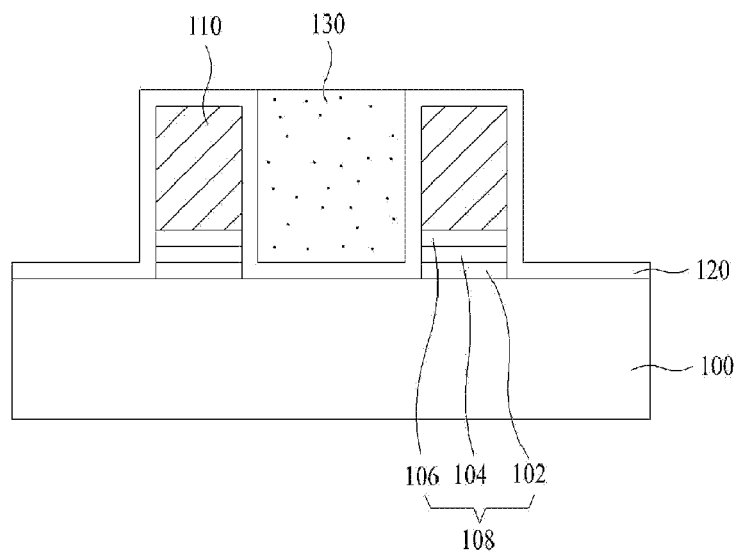

The exposed novolak resin 130 is removed by using the photoresist pattern 132 as a mask in a recess etching process using $O_2$ gas. As a result, the novolak resin 130 remains only between the polysilicon gates 110, as shown in FIG. 2D. The remaining photoresist pattern 132 of FIG. 2C is removed in the asking process.

Figure 2E:
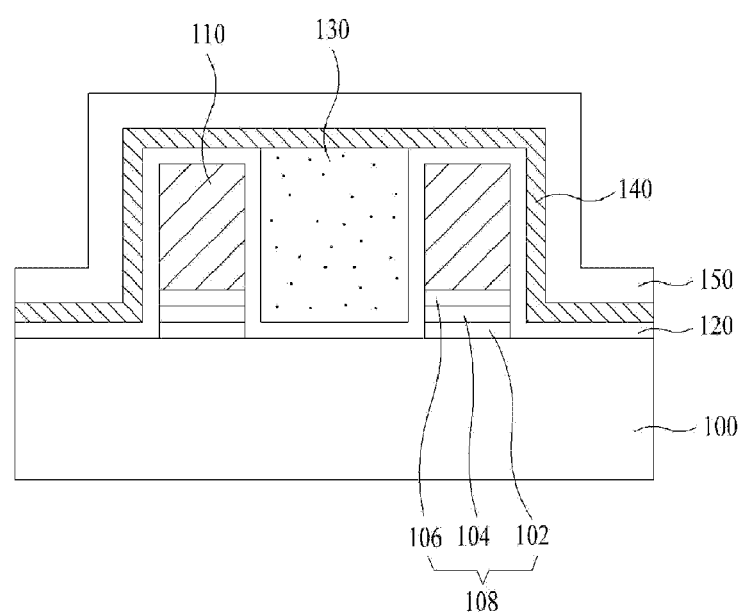

As shown in FIG. 2E, a low temperature oxide (LTO) 140 and a second polysilicon layer 150 are sequentially formed on the substrate 100 having the novolak resin 130 in the region between the nearest adjacent polysilicon gates 110. The LTO layer 140 may be formed by CVD of a silicon oxide from a silicon source such as TEOS or silane and an oxygen source such as dioxygen and/or ozone. The CVD may be performed using a plasma.

The LTO layer 140 has a thickness of 10 Å ~50 Å, and is configured to protect the novolak resin 130. If the polysilicon layer 150 is formed directly on the novolak resin 130 without the LTO layer 140, a high temperature etching process could negatively affect the novolak resin 130, which is a photosensitive material. As a result, the LTO layer 140 is formed to prevent degradation of the novolak resin 130. Alternatively, a thin silicon nitride layer (e.g., having a thickness of 10 Å ~50 Å) can be formed on the substrate 100 and the novolak resin 130 prior to deposition of the LTO layer 140 when there may be an insufficient etch selectivity between the LTO layer 140 and the gate oxide 120.

In one embodiment, the second polysilicon layer 150 forms the control gate. In another embodiment, the second polysilicon layer 150 forms part of a word line.

Figure 2F:
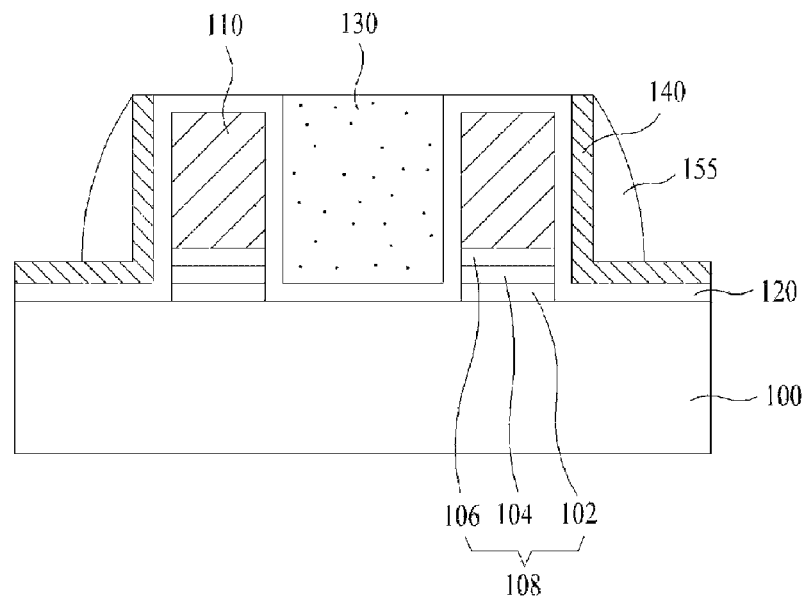

As shown in FIG. 2F, the control gate or word line 155 is formed on each outer sidewall of the polysilicon gates 110 using the LTO layer 140 (or, alternatively, the gate oxide layer 120 and the novolak resin 130) as an etch stop (or etching prevention) layer in a fully anisotropic dry etch process. The control gate 155 may have a sidewall spacer shape.

Referring back to FIG. 2E, the second polysilicon layer 150 is formed on and/or over the low temperature oxide layer 140. The LTO layer 140 on the polysilicon gate 110 and the second polysilicon layer 150 may be removed simultaneously. Alternatively, when there is sufficient etching selectivity between the second polysilicon layer 150, the LTO layer 140 and the immediately underlying layer(s), the second polysilicon layer 150 and the LTO layer 140 can be removed sequentially. In either case, in one embodiment, the LTO layer 140 exposed by the control gate or word line 155 (FIG. 2F) can be removed.

Figure 2G:
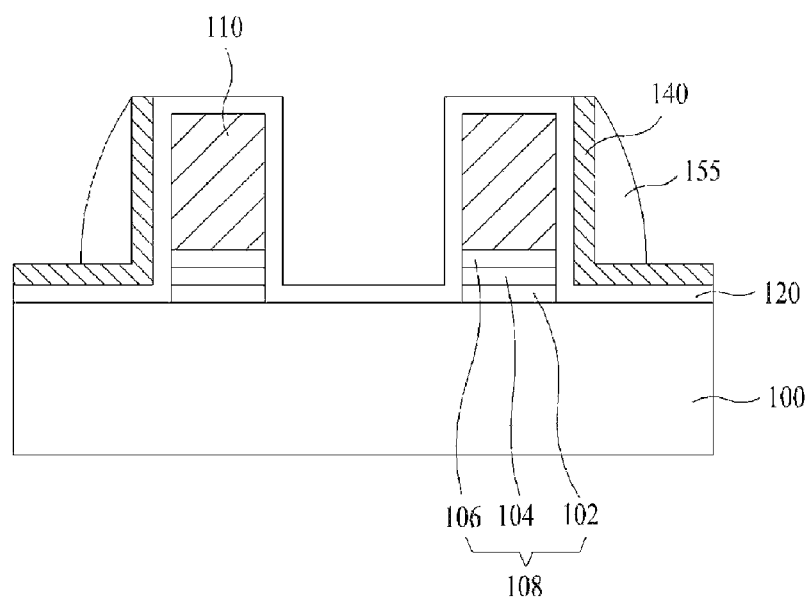

As shown in FIG. 2G, a recess (e.g., etching) process is performed to remove the novolak resin 130 between the polysilicon gates 110. The recess process removes only the novolak resin 130, and it is performed without inadvertently etching other regions (e.g., the polysilicon gates 110).

After the novolak resin is formed between the polysilicon gates, the control gate or word line is formed as mentioned above. When polysilicon material is removed to form the polysilicon gates, inadvertent etching may be prevented. Thus, characteristics of the flash memory device may be improved according to various embodiments of the present invention.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A method for fabricating a flash memory device comprising:
    forming an ONO layer and a first polysilicon layer on a substrate;
    patterning the first polysilicon layer and the ONO layer to form a plurality of floating gates;
    forming a gate oxide layer on or over the substrate and the plurality of floating gates;
    forming a resin on the substrate having the gate oxide layer thereon;
    removing a portion of the resin to expose the gate oxide layer, keeping a region between adjacent floating gates filled with the resin;
    removing the resin exposed by a photoresist pattern over resin between nearest adjacent floating gates;
    forming a second polysilicon layer on or over the floating gates and the resin;
    forming sidewall spacers on outer surfaces of the gate oxide by etching the second polysilicon layer; and
    removing the remaining resin between the nearest adjacent floating gates.

2. The method of claim 1, wherein the resin comprises a novolak resin.

3. The method of claim 2, wherein removing the resin comprises patterning and developing a photoresist such that a photoresist pattern is formed over the resin between the nearest adjacent floating gates.

4. The method of claim 3, further comprising:
   forming a low temperature oxide layer on the substrate having the resin between the nearest adjacent floating gates.

5. The method of claim 4, wherein the low temperature oxide layer has a thickness of 10~50 Å.

6. The method of claim 3, wherein removing the resin further comprises using the photoresist pattern as a mask in an etching process that uses $O_2$ gas.

7. The method of claim 4, wherein the low temperature oxide layer is formed on or over each floating gate, each patterned first polysilicon gate, and/or the gate oxide.

8. The method of claim 1, wherein forming the ONO layer comprises sequentially stacking a tunnel oxide layer, a trap nitride layer, and a block oxide layer.

9. The method of claim 8, wherein the tunnel oxide layer comprises a thermal silicon dioxide layer.

10. The method of claim 9, wherein the trap nitride layer comprises a silicon nitride layer, and forming the block oxide layer comprises chemical vapor depositing a silicon dioxide layer.

11. The method of claim 4, further comprising forming the polysilicon sidewall spacers on and/or over the low temperature oxide layer.

* * * * *